United States Patent
Cheng et al.

(10) Patent No.: US 11,978,783 B2
(45) Date of Patent: May 7, 2024

(54) VERTICAL FIN FIELD EFFECT TRANSISTOR DEVICES WITH REDUCED TOP SOURCE/DRAIN VARIABILITY AND LOWER RESISTANCE

(71) Applicant: INTERNATIONAL BUSINESS MACHINES CORPORATION, Armonk, NY (US)

(72) Inventors: Kangguo Cheng, Schenectady, NY (US); Shogo Mochizuki, Clifton Park, NY (US); Choonghyun Lee, Rensselaer, NY (US); Juntao Li, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 524 days.

(21) Appl. No.: 17/136,548

(22) Filed: Dec. 29, 2020

(65) Prior Publication Data
US 2021/0119019 A1    Apr. 22, 2021

Related U.S. Application Data

(62) Division of application No. 16/134,526, filed on Sep. 18, 2018, now Pat. No. 10,916,638.

(51) Int. Cl.
*H01L 29/66* (2006.01)
*H01L 21/225* (2006.01)
(Continued)

(52) U.S. Cl.
CPC .... *H01L 29/66666* (2013.01); *H01L 21/2251* (2013.01); *H01L 21/324* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 6,686,604 B2 * 2/2004 Layman ............ H01L 29/66666
257/329
7,148,541 B2 * 12/2006 Park .................... H01L 29/7851
257/401
(Continued)

OTHER PUBLICATIONS

List of IBM Patents or Patent Applications Treated as Related dated Dec. 29, 2020, 2 pages.

*Primary Examiner* — Maliheh Malek
(74) *Attorney, Agent, or Firm* — Tutunjian & Bitetto, P.C.; Robert Richard Aragona

(57) ABSTRACT

A method of forming a fin field effect device is provided. The method includes forming one or more vertical fins on a substrate and a fin template on each of the vertical fins. The method further includes forming a gate structure on at least one of the vertical fins, and a top spacer layer on the at least one gate structure, wherein at least an upper portion of the at least one of the one or more vertical fins is exposed above the top spacer layer. The method further includes forming a top source/drain layer on the top spacer layer and the exposed upper portion of the at least one vertical fin. The method further includes forming a sacrificial spacer on opposite sides of the fin templates and the top spacer layer, and removing a portion of the top source/drain layer not covered by the sacrificial spacer to form a top source/drain electrically connected to the vertical fins.

18 Claims, 9 Drawing Sheets

(51) Int. Cl.
*H01L 21/324* (2006.01)
*H01L 21/768* (2006.01)
*H01L 23/535* (2006.01)
*H01L 29/08* (2006.01)
*H01L 29/78* (2006.01)

(52) U.S. Cl.
CPC .. *H01L 21/76805* (2013.01); *H01L 21/76843* (2013.01); *H01L 21/76895* (2013.01); *H01L 23/535* (2013.01); *H01L 29/0847* (2013.01); *H01L 29/66553* (2013.01); *H01L 29/7827* (2013.01)

(58) Field of Classification Search
CPC ......... H01L 27/10826; H01L 27/10879; H01L 27/1211; H01L 2029/7857–7858; H01L 2924/13067; H01L 29/04–045; H01L 29/16–1608; H01L 29/18–185; H01L 29/22–2206; H01L 29/36–365; H01L 29/41791; H01L 29/66795–66818; H01L 29/785–7856; H01L 21/225; H01L 21/2251; H01L 21/2252; H01L 29/66666; H01L 29/66553; H01L 29/0843–0847; H01L 29/7827; H01L 29/105; H01L 21/76805; H01L 23/535
See application file for complete search history.

(56) References Cited

U.S. PATENT DOCUMENTS

| | | | | |
|---|---|---|---|---|
| 7,241,655 | B2* | 7/2007 | Tang | H01L 29/7827 438/269 |
| 9,502,265 | B1* | 11/2016 | Jiang | H01L 29/42392 |
| 9,530,866 | B1* | 12/2016 | Zhang | B82Y 10/00 |
| 9,536,793 | B1* | 1/2017 | Zhang | H01L 21/823864 |
| 9,614,077 | B1* | 4/2017 | Cheng | H01L 29/66545 |
| 9,640,636 | B1* | 5/2017 | Bentley | H01L 29/78642 |
| 9,647,112 | B1* | 5/2017 | Balakrishnan | H01L 29/0847 |
| 9,647,123 | B1* | 5/2017 | Balakrishnan | H01L 29/7802 |
| 9,653,575 | B1* | 5/2017 | Basker | H01L 29/78618 |
| 9,711,618 | B1* | 7/2017 | Cheng | H01L 29/42392 |
| 9,716,170 | B1* | 7/2017 | Cheng | H01L 29/42356 |
| 9,728,542 | B1* | 8/2017 | Balakrishnan | H01L 29/78642 |
| 9,735,246 | B1* | 8/2017 | Basker | H01L 21/3081 |
| 9,735,253 | B1* | 8/2017 | Bi | H10B 43/27 |
| 9,748,359 | B1* | 8/2017 | Gluschenkov | H01L 29/7827 |
| 9,761,728 | B1* | 9/2017 | Cheng | H01L 29/66666 |
| 9,773,708 | B1* | 9/2017 | Zhang | H01L 29/66666 |
| 9,773,913 | B1* | 9/2017 | Balakrishnan | H01L 21/28518 |
| 9,780,088 | B1* | 10/2017 | Balakrishnan | H01L 29/0649 |
| 9,780,208 | B1* | 10/2017 | Xie | H01L 27/088 |
| 9,812,575 | B1* | 11/2017 | Reznicek | H01L 21/823807 |
| 9,837,405 | B1* | 12/2017 | Cheng | H01L 21/31111 |
| 9,865,730 | B1* | 1/2018 | Jagannathan | H01L 21/02612 |
| 9,899,515 | B1* | 2/2018 | Cheng | H01L 21/823828 |
| 9,935,018 | B1* | 4/2018 | Xie | H01L 21/823468 |
| 9,941,374 | B2* | 4/2018 | Diaz | H01L 29/42392 |
| 10,043,900 | B1* | 8/2018 | Bi | H01L 29/7827 |
| 10,141,448 | B1* | 11/2018 | Miao | H01L 21/823864 |
| 10,199,278 | B2* | 2/2019 | Cheng | H01L 29/0676 |
| 10,229,986 | B1* | 3/2019 | Jagannathan | H01L 29/7827 |
| 10,236,355 | B2* | 3/2019 | Cheng | H01L 29/41791 |
| 10,236,379 | B2* | 3/2019 | Bentley | H01L 29/1033 |
| 10,276,719 | B1* | 4/2019 | Duriez | H01L 29/42392 |
| 10,381,262 | B2* | 8/2019 | Cheng | H01L 21/823487 |
| 10,388,766 | B2* | 8/2019 | Mochizuki | H01L 29/66795 |
| 10,418,368 | B1* | 9/2019 | Bentley | H01L 21/823487 |
| 10,439,044 | B1* | 10/2019 | Lee | H01L 29/66666 |
| 10,453,934 | B1* | 10/2019 | Basker | H01L 29/7827 |
| 10,461,174 | B1* | 10/2019 | Chi | H01L 29/7827 |
| 10,461,186 | B1* | 10/2019 | Zhang | H01L 21/823871 |
| 10,475,923 | B1* | 11/2019 | Cheng | H01L 21/823418 |
| 10,504,794 | B1* | 12/2019 | Lee | H01L 29/0847 |
| 10,505,019 | B1* | 12/2019 | Miao | H01L 29/66666 |
| 10,535,652 | B2* | 1/2020 | Cheng | H01L 21/823475 |
| 10,559,491 | B2* | 2/2020 | Cheng | H01L 29/7827 |
| 10,573,753 | B1* | 2/2020 | Zang | H01L 21/76832 |
| 10,593,797 | B2* | 3/2020 | Mochizuki | H01L 29/78681 |
| 10,600,885 | B2* | 3/2020 | Cheng | H01L 29/66553 |
| 10,607,892 | B2* | 3/2020 | Miao | H01L 29/66545 |
| 10,629,499 | B2* | 4/2020 | Lee | H01L 21/823878 |
| 10,658,299 | B2* | 5/2020 | Lee | H01L 21/82385 |
| 10,680,102 | B2* | 6/2020 | Lee | H01L 29/161 |
| 10,686,057 | B2* | 6/2020 | Lee | H01L 21/2257 |
| 10,714,593 | B2* | 7/2020 | Balakrishnan | H01L 29/66666 |
| 10,741,652 | B2* | 8/2020 | Lee | H01L 27/088 |
| 10,741,663 | B1* | 8/2020 | Bao | H01L 29/4958 |
| 10,777,679 | B2* | 9/2020 | Lee | H01L 29/42356 |
| 10,903,123 | B2* | 1/2021 | Miao | H01L 21/3213 |
| 10,930,778 | B2* | 2/2021 | Cheng | H01L 29/518 |
| 10,950,492 | B2* | 3/2021 | Cheng | H01L 29/42392 |
| 10,978,422 | B2* | 4/2021 | Yun | H01L 25/043 |
| 11,107,905 | B2* | 8/2021 | Miao | H01L 21/324 |
| 11,177,369 | B2* | 11/2021 | Yu | H01L 21/02639 |
| 11,251,285 | B2* | 2/2022 | Bao | H01L 29/7827 |
| 11,430,864 | B2* | 8/2022 | Xu | H01L 29/0653 |
| 11,621,348 | B2* | 4/2023 | Cheng | H01L 29/518 257/329 |
| 11,637,179 | B2* | 4/2023 | Cheng | H01L 21/764 257/329 |
| 2011/0253981 | A1* | 10/2011 | Rooyackers | H01L 29/66356 977/840 |
| 2014/0159159 | A1* | 6/2014 | Steigerwald | H01L 29/41766 257/369 |
| 2015/0287809 | A1* | 10/2015 | Kerber | H01L 29/66795 438/479 |
| 2016/0268171 | A1* | 9/2016 | Wei | H01L 29/66795 |
| 2017/0069753 | A1* | 3/2017 | Toh | H01L 21/283 |
| 2017/0222045 | A1* | 8/2017 | Leobandung | H01L 29/78642 |
| 2017/0301776 | A1* | 10/2017 | Zhang | H01L 29/7827 |
| 2017/0358497 | A1* | 12/2017 | Cheng | H01L 29/0649 |
| 2017/0365526 | A1* | 12/2017 | Jeong | H01L 29/4966 |
| 2017/0373159 | A1* | 12/2017 | Cheng | H01L 29/66795 |
| 2018/0006118 | A1* | 1/2018 | Mallela | H01L 29/0847 |
| 2018/0012969 | A1* | 1/2018 | Cheng | H01L 21/823431 |
| 2018/0033868 | A1* | 2/2018 | Anderson | H01L 29/456 |
| 2018/0053821 | A1* | 2/2018 | Mallela | H01L 29/785 |
| 2018/0053823 | A1* | 2/2018 | Mallela | H01L 29/4991 |
| 2018/0053840 | A1* | 2/2018 | Mallela | H01L 29/0649 |
| 2018/0061967 | A1* | 3/2018 | Bi | H01L 21/76816 |
| 2018/0108596 | A1* | 4/2018 | Bonilla | H01L 29/4991 |
| 2018/0122800 | A1* | 5/2018 | Cheng | H01L 29/7827 |
| 2018/0122936 | A1* | 5/2018 | Cheng | H01L 21/823871 |
| 2018/0138093 | A1* | 5/2018 | Adusumilli | H01L 29/161 |
| 2018/0226489 | A1* | 8/2018 | Bi | H01L 29/7827 |
| 2018/0269312 | A1* | 9/2018 | Xie | H01L 29/78654 |
| 2018/0269320 | A1* | 9/2018 | Chi | H01L 29/66795 |
| 2018/0350695 | A1* | 12/2018 | Cheng | H01L 21/823487 |
| 2018/0350953 | A1* | 12/2018 | Balakrishnan | H01L 29/0847 |
| 2018/0358269 | A1* | 12/2018 | Bao | H01L 21/823418 |
| 2018/0366553 | A1* | 12/2018 | Zang | H01L 23/535 |
| 2019/0067474 | A1* | 2/2019 | Wong | H01L 29/41741 |
| 2019/0097024 | A1* | 3/2019 | Li | H01L 21/823487 |
| 2019/0115452 | A1* | 4/2019 | Cheng | H01L 29/7827 |
| 2019/0123174 | A1* | 4/2019 | Mochizuki | H01L 21/823864 |
| 2019/0148372 | A1* | 5/2019 | Miao | H01L 29/66666 257/329 |
| 2019/0157452 | A1* | 5/2019 | Kim | H01L 29/4232 |
| 2019/0172830 | A1* | 6/2019 | Ok | H01L 21/823807 |
| 2019/0172927 | A1* | 6/2019 | Jagannathan | H01L 29/7827 |
| 2019/0189520 | A1* | 6/2019 | Zhang | H01L 21/823487 |
| 2019/0198400 | A1* | 6/2019 | Miao | H01L 29/7827 |
| 2019/0319118 | A1* | 10/2019 | Lee | H01L 21/02255 |
| 2019/0355833 | A1* | 11/2019 | Miao | H01L 21/28238 |
| 2019/0385917 | A1* | 12/2019 | Lee | H01L 21/823878 |
| 2019/0386135 | A1* | 12/2019 | Li | H01L 29/66666 |
| 2020/0006553 | A1* | 1/2020 | Li | H01L 29/1033 |
| 2020/0013879 | A1* | 1/2020 | Li | H01L 21/823412 |
| 2020/0027981 | A1* | 1/2020 | Park | H01L 29/7827 |
| 2020/0027991 | A1* | 1/2020 | Lee | H01L 21/823431 |
| 2020/0044056 | A1* | 2/2020 | Miao | H01L 21/28238 |
| 2020/0058767 | A1* | 2/2020 | Cheng | H01L 29/0653 |

(56) References Cited

U.S. PATENT DOCUMENTS

| | | | |
|---|---|---|---|
| 2020/0066599 A1* | 2/2020 | Zhang | H01L 29/6656 |
| 2020/0066603 A1* | 2/2020 | Bao | H01L 21/823842 |
| 2020/0066604 A1* | 2/2020 | Mochizuki | H01L 29/7827 |
| 2020/0075736 A1* | 3/2020 | Lee | H01L 21/823487 |
| 2020/0075738 A1* | 3/2020 | Zang | H01L 29/785 |
| 2020/0083106 A1* | 3/2020 | Cheng | H01L 21/823418 |
| 2020/0105614 A1* | 4/2020 | Bi | H01L 29/7827 |
| 2020/0105928 A1* | 4/2020 | Lee | H01L 29/045 |
| 2020/0111714 A1* | 4/2020 | Lee | H01L 29/785 |
| 2020/0119010 A1* | 4/2020 | Lee | H01L 21/823481 |
| 2020/0119190 A1* | 4/2020 | Cheng | H01L 29/7827 |
| 2020/0127110 A1* | 4/2020 | Lee | H01L 21/7682 |
| 2020/0135873 A1* | 4/2020 | Wu | H01L 29/785 |
| 2020/0144378 A1* | 5/2020 | Lee | H01L 29/66803 |
| 2020/0152517 A1* | 5/2020 | Miao | H01L 29/66666 |
| 2020/0161303 A1* | 5/2020 | Bi | H01L 29/0847 |
| 2020/0176611 A1* | 6/2020 | Lee | H01L 29/401 |
| 2020/0235015 A1* | 7/2020 | Lee | H01L 21/823814 |
| 2020/0235238 A1* | 7/2020 | Lee | H01L 29/42376 |
| 2020/0258790 A1* | 8/2020 | Li | H01L 29/7827 |
| 2020/0258941 A1* | 8/2020 | Lee | H10B 63/34 |
| 2020/0259000 A1* | 8/2020 | Mochizuki | H01L 29/6656 |
| 2020/0266288 A1* | 8/2020 | Cheng | H01L 27/092 |
| 2020/0279779 A1* | 9/2020 | Li | H01L 29/7827 |
| 2020/0286857 A1* | 9/2020 | Yun | H01L 21/70 |
| 2020/0287024 A1* | 9/2020 | Dewey | H01L 27/0924 |
| 2020/0303503 A1* | 9/2020 | Lee | H01L 21/823842 |
| 2021/0091207 A1* | 3/2021 | Yu | H01L 21/823885 |
| 2022/0393019 A1* | 12/2022 | Wu | H01L 29/0657 |
| 2023/0022802 A1* | 1/2023 | Wang | H01L 21/823475 |
| 2023/0031574 A1* | 2/2023 | Xie | H01L 29/41741 |
| 2023/0082449 A1* | 3/2023 | Wu | H01L 21/823885 257/329 |
| 2023/0091229 A1* | 3/2023 | Li | H01L 29/66439 257/329 |
| 2023/0099767 A1* | 3/2023 | Cheng | H01L 21/823418 257/288 |
| 2023/0103070 A1* | 3/2023 | Jun | H01L 29/7827 257/329 |

\* cited by examiner

VERTICAL FIN FIELD EFFECT TRANSISTOR DEVICES WITH REDUCED TOP SOURCE/DRAIN VARIABILITY AND LOWER RESISTANCE

BACKGROUND

Technical Field

The present invention generally relates to vertical fin field effect devices, and more particularly to vertical fin field effect device fabrication.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are electrically coupled together.

SUMMARY

In accordance with an embodiment of the present invention, a method of forming a fin field effect device is provided. The method includes forming one or more vertical fins on a substrate and a fin template on each of the one or more vertical fins. The method further includes forming a gate structure on at least one of the one or more vertical fins. The method further includes forming a top spacer layer on the at least one gate structure, wherein at least an upper portion of the at least one of the one or more vertical fins is exposed above the top spacer layer. The method further includes forming a top source/drain layer on the top spacer layer and the exposed upper portion of the at least one of the one or more vertical fins. The method further includes forming a sacrificial spacer on opposite sides of the at least one of the one or more fin templates and the top spacer layer, and removing a portion of the top source/drain layer not covered by the sacrificial spacer to form a top source/drain electrically connected to the at least one of the one or more vertical fins.

In accordance with another embodiment of the present invention, a method of forming a fin field effect device is provided. The method includes forming a bottom source/drain layer on a substrate, and forming one or more vertical fins on the bottom source/drain layer and a fin template on each of the one or more vertical fins. The method further includes forming a bottom spacer layer on the bottom source/drain layer. The method further includes forming a gate structure on the bottom spacer layer and at least one of the one or more vertical fins. The method further includes forming a top spacer layer on the at least one gate structure, wherein at least an upper portion of the at least one of the one or more vertical fins is exposed above the top spacer layer. The method further includes forming a top source/drain layer on the top spacer layer and the exposed upper portion of the at least one of the one or more vertical fins. The method further includes forming a sacrificial spacer on opposite sides of the at least one of the one or more fin templates and the top spacer layer, and removing a portion of the top source/drain layer not covered by the sacrificial spacer to form a top source/drain electrically connected to the at least one of the one or more vertical fins.

In accordance with yet another embodiment of the present invention, a vertical fin field effect transistor device is provided. The vertical fin field effect transistor device includes one or more vertical fins on a substrate. The vertical fin field effect transistor device further includes a top source/drain electrically connected to at least one of the one or more vertical fins, and a conductive fill that wraps around the sidewalls of the top source/drain.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide uniform top source/drains on vertical fins that can have non-uniform top portions. Epitaxial growth of top source/drains on non-uniform top portions of a vertical fin can be difficult due to different growth planes being simultaneously exposed at the top of the vertical fin. The top portion of a vertical fin may not have well defined and consistent surface planes, but a narrow, convex surface on which epitaxial or heteroepitaxial growth can be difficult and inconsistent over multiple fins. The curved surfaces can have numerous exposed crystal planes without a dominant growth plane.

Embodiments of the present invention provide a fabrication process that avoids inconsistent fabrication results by forming top source/drains on one or more sidewalls of the vertical fins, where the sidewalls have more consistent sizes and predetermined exposed crystal planes. Lateral epitaxial growth on the sidewalls of the vertical fins can allow controlled formation of the top source/drain with intended sizes and crystal alignment from a dominant crystal plane. The epitaxial growth on the dominant crystal planes of the exposed sidewalls can provide consistent symmetrical top source/drain formation. The fabrication process from the sidewalls of the vertical fins can avoid poorly formed and asymmetrical top source/drains that would otherwise be formed from the narrow and curved top surfaces of the vertical fins.

Embodiments of the present invention provide multiple vertical fin devices with uniform top source/drains that can provide more consistent device properties and performance. Use of self-aligned spacers with controlled thicknesses can provide uniform and symmetrical top source/drains for vertical fin field effect transistor (VFinFET) devices.

Exemplary applications/uses to which the present invention can be applied include, but are not limited to: logic devices (e.g., NAND gate circuits, NOR gate circuits, inverters, etc.) and memory devices (e.g., static random access memory (SRAM), dynamic access memory (DRAM).

It is to be understood that aspects of the present invention will be described in terms of a given illustrative architecture; however, other architectures, structures, substrate materials and process features and steps can be varied within the scope of aspects of the present invention.

Figure 1:
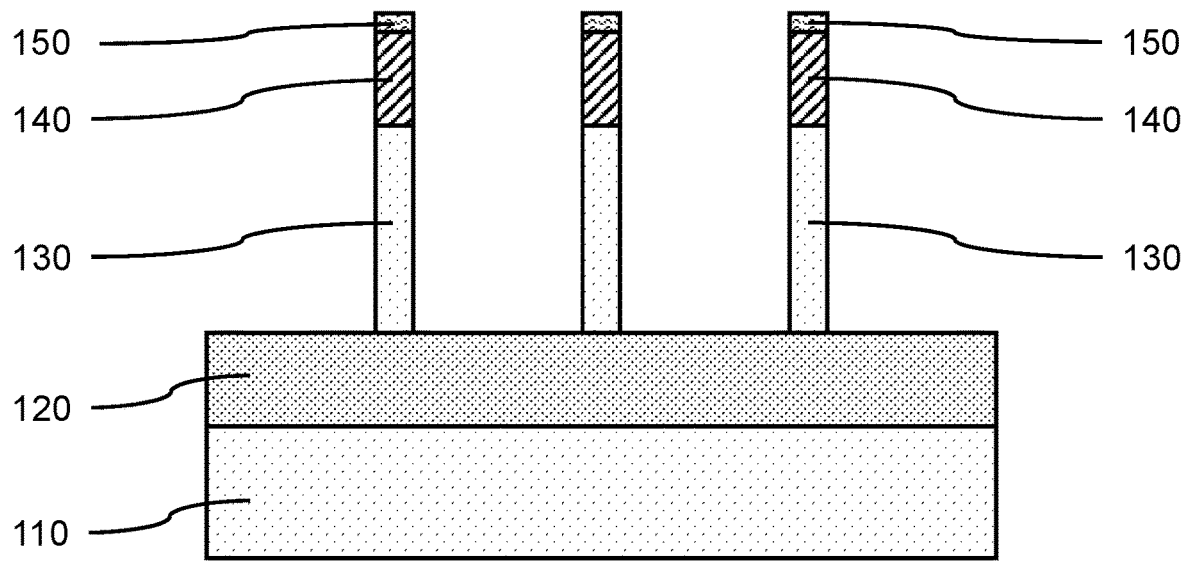
FIG. 1 is a cross-sectional side view showing a plurality of vertical fins on a bottom source/drain layer and substrate, a fin template and fin cap is formed on each of the vertical fins, in accordance with an embodiment of the present invention.

Referring now to the drawings in which like numerals represent the same or similar elements and initially to FIG. 1, a cross-sectional side view of a plurality of vertical fins on a bottom source/drain layer and substrate, and a fin template and fin cap formed on each of the vertical fins, is shown, in accordance with an embodiment of the present invention.

In one or more embodiments, one or more vertical fins 130 can be formed on a substrate 110. The vertical fins 130 can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins 130 may be formed by a direct write process or double patterning process using, for example, immersion lithography, extreme ultraviolet lithography, or x-ray lithography.

In one or more embodiments, a bottom source/drain layer 120 can be formed on the substrate 110, where the bottom source/drain layer 120 can be formed by an epitaxial or heteroepitaxial growth process. The bottom source/drain layer 120 can be doped to be an n-type bottom source/drain layer or a p-type bottom source/drain layer. In various embodiments, the bottom source/drain layer 120 can be a semiconductor material, including, but not limited to n-type (e.g., P or As) doped silicon (Si) or p-type (e.g., B) doped silicon-germanium (SiGe). The bottom source/drain layer 120 can be the same semiconductor material as the substrate 110. The vertical fins 130 can be formed from a semiconductor layer formed on the bottom source/drain layer 120, for example, by an epitaxial or heteroepitaxial growth process.

In various embodiments, a fin template 140 can be formed on each of the vertical fins 130 as part of the patterning process, where the fin templates 140 can be a hardmask material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof. In various embodiments, a fin cap 150 can be formed on each of the fin templates 140, where the fin caps 150 can also be formed as part of the patterning process. The fin cap(s) 150 can be a hardmask material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof, that is different from the material of the fin template(s) 140.

The fin templates 140 can be formed from a fin template layer formed on the semiconductor layer, and the fin caps 150 can be formed from a fin cap layer formed on the fin template layer, where the fin templates and fin caps can be formed by the patterning process.

In one or more embodiments, vertical fins 130 can be laterally adjacent to each other (i.e., in a row). The facing sidewalls of adjacent vertical fins 130 can be separated by a distance in a range of about 10 nm to about 50 nm, or in a range of about 20 nm to about 40 nm, although other distances are also contemplated. In various embodiments, the exposed sidewalls of the vertical fins can be {100} crystal planes.

In various embodiments, the widths of the semiconductor vertical fin(s) 130 can be in a range of about 5 nanometers (nm) to about 15 nm, or about 6 nm to about 10 nm, or about 6 nm to about 8 nm, although other widths are also contemplated.

In various embodiments, the height of the semiconductor vertical fin(s) 130 can be in a range of about 20 nanometers (nm) to about 100 nm, or about 30 nm to about 50 nm, although other heights are also contemplated. Although the vertical fins 111 are depicted in the figures perpendicular to the substrate 110 (i.e., having a 90 degree angle), the fins can have a tapered sidewall that does not meet the substrate at a right angle (i.e., not exactly 90 degree). The top surface of the vertical fins 130 may not be perfectly flat or rectangular, but may have a convex curved surface. The substrate surface can have a curved (recessed) profile between the vertical fins 130.

In one or more embodiments, a substrate 110 can be, for example, a single crystal semiconductor material wafer or a semiconductor-on-insulator stacked wafer. The substrate can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)).

In one or more embodiments, the substrate 110 or an active semiconductor layer can be a crystalline semiconductor, for example, a IV or IV-IV semiconductor (e.g., silicon (Si), silicon carbide (SiC), silicon-germanium (SiGe), germanium (Ge)) or a III-V semiconductor (e.g., gallium-arsenide (GaAs), indium-phosphide (InP), indium-antimonide (InSb)).

Figure 2:
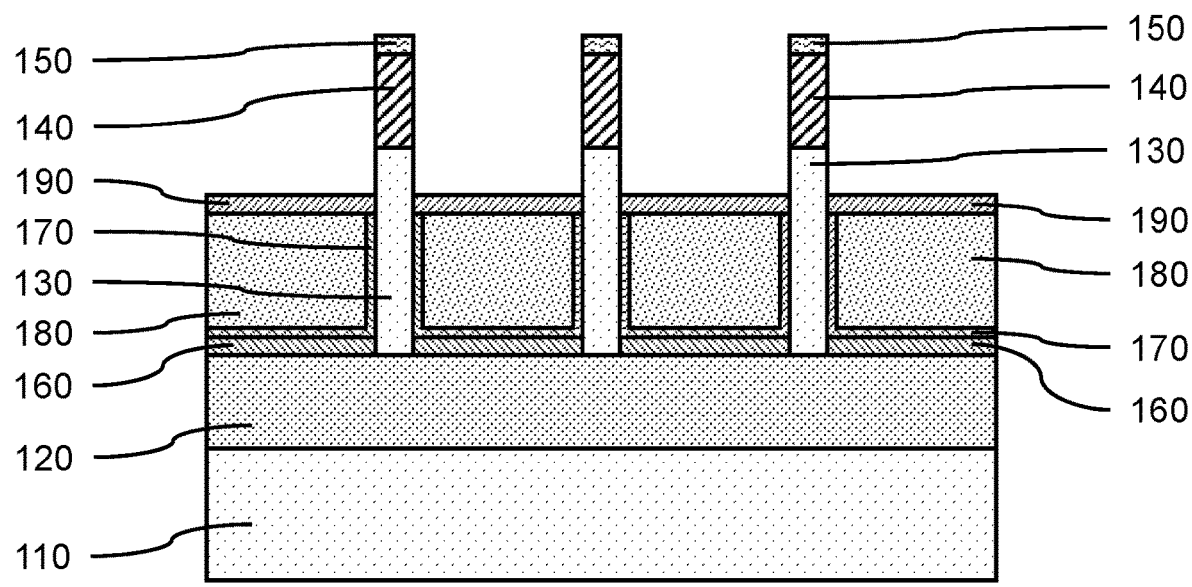
FIG. 2 is a cross-sectional side view showing a bottom spacer layer on the bottom source/drain layer, and a gate structure on the bottom spacer layer and each of the plurality of vertical fins, in accordance with an embodiment of the present invention.

FIG. 2 is a cross-sectional side view showing a bottom spacer layer on the bottom source/drain layer, and a gate structure on the bottom spacer layer and each of the plurality of vertical fins, in accordance with an embodiment of the present invention.

In one or more embodiments, a bottom spacer layer 160 can be formed on the bottom source/drain layer 120, where the bottom spacer layer can be formed by a directional deposition, for example, a high density plasma (HDP) or gas cluster ion beam (GCIB), or by a blanker deposition, for example, chemical vapor deposition (CVD) or plasma enhanced CVD (PECVD) and etched back to an intended thickness.

In various embodiments, the bottom spacer layer 160 can have a thickness in a range of about 3 nm to about 10 nm, or about 5 nm to about 7 nm, although other thicknesses are also contemplated.

In various embodiments, the bottom spacer layer 160 can be a dielectric material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof. The bottom spacer layer 160 can be a material different from the in templates 140 and/or the fin caps 150 to allow selective removal.

In one or more embodiments, a gate structure can be formed on the bottom spacer layer 160, where the gate structure can include a gate dielectric layer 170 and a gate electrode 180, the gate electrode can include a work function layer on the gate dielectric layer 180 and a conductive gate fill on the work function layer. The work function layer can be formed by a conformal deposition, for example, atomic layer deposition (ALD) or plasma enhanced ALD (PEALD), on the gate dielectric layer 170. The work function layer can be a conducting metallic nitride or carbide compound material, for example, tantalum nitride (TaN), titanium nitride (TiN), tantalum carbide (TaC), titanium carbide (TiC), titanium aluminum carbide (TiAlC), and combinations thereof.

The conductive gate fill can be formed by a blanket deposition. In various embodiments, the conductive gate fill can be a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, or any suitable combination of these materials.

In one or more embodiments, a top spacer layer 190 can be formed on the gate dielectric layer 170 and a gate electrode 180, where the top spacer layer 190 can be formed by a directional deposition, (e.g., HDP or GCIB), or a conformal deposition (e.g., ALD, PEALD). An etch-back can be used to remove excess deposited materials on the sidewalls of the vertical fins 130. In various embodiments, an upper portion of the vertical fin(s) 130 can extend above the top surface of the top spacer layer 190 by a predetermined height. In various embodiments, the upper portion of the vertical fin(s) 130 can extend above the top surface of the top spacer layer 190 by a height in the range of about 10 nm to about 50 nm, or about 20 nm to about 30 nm, although other heights are also contemplated. The fin template 140 and fin cap 150 can be exposed above the top spacer layer 190. The height of the upper portion of the vertical fin(s) 130 exposed above the top spacer layer can be sufficient to provide a uniform crystal face for the epitaxial growth of a top source/drain layer.

In various embodiments, the top spacer layer 190 can have a thickness in a range of about 3 nm to about 10 nm, or about 5 nm to about 7 nm, although other thicknesses are also contemplated.

Figure 3:
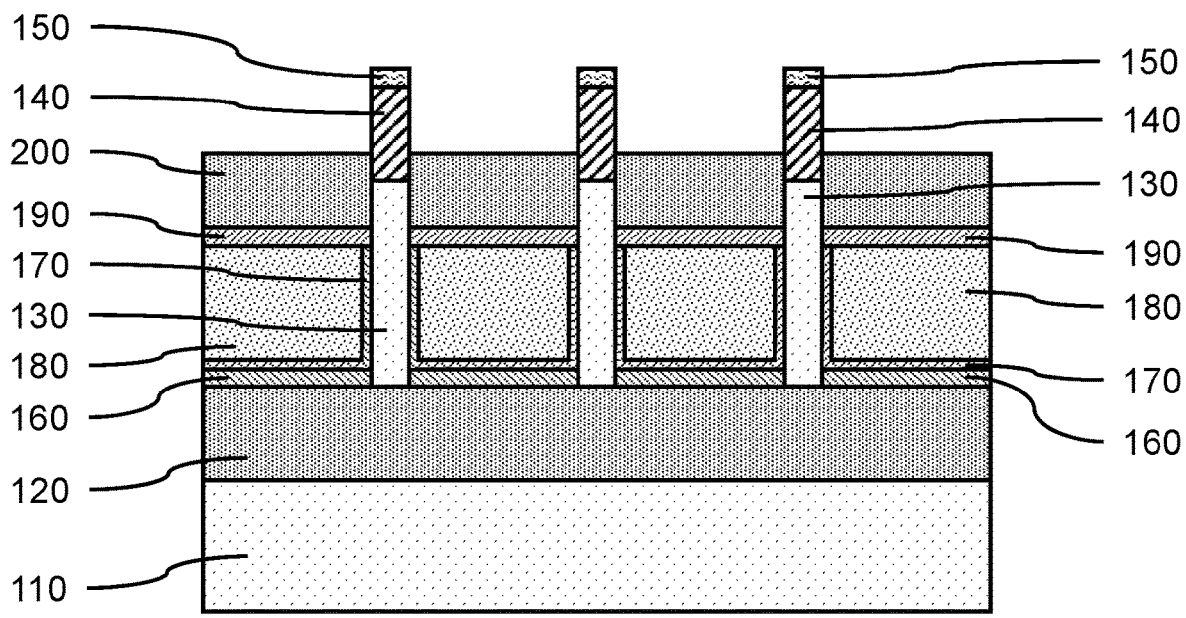
FIG. 3 is a cross-sectional side view showing a top source/drain layer formed on a top spacer layer and each of the plurality of vertical fins, in accordance with an embodiment of the present invention.

FIG. 3 is a cross-sectional side view showing a top source/drain layer formed on a top spacer layer and each of the plurality of vertical fins, in accordance with an embodiment of the present invention.

In one or more embodiments, a top source/drain layer 200 can be formed on the top spacer layer 190, where the top source/drain layer 200 can be formed by an epitaxial or heteroepitaxial growth process. The top source/drain layer 200 can be formed by a lateral epitaxial or heteroepitaxial growth process from the exposed sidewalls of the vertical fin(s) 130. In various embodiments, the vertical fins 130 can have sidewalls with an exposed {100} crystal plane for lateral growth of the top source/drain layer 200.

In one or more embodiments, the top source/drain layer 200 can have a thickness in a range of about 10 nm to about 60 nm, or about 20 nm to about 40 nm, although other thicknesses are also contemplated. The thickness of the top source/drain layer 200 can be greater than the height of the exposed sidewalls of the vertical fin(s) 130, such that the top source/drain layer 200 can cover a lower portion of a fin template 140 on the underlying vertical fin.

In various embodiments, the top source/drain layer 200 can be doped in situ (i.e., during epitaxial growth) or ex situ (i.e., after formation of the top source/drain layer) or both. The top source/drain layer 200 can be doped using, for example, ion implantation, plasma doping, gas phase doping, solid phase doping, and/or liquid phase doping.

In various embodiments, the bottom source/drain layer 120 can have a dopant concentration in the range of about $1\times10^{20}/cm^3$ to about $3\times10^{21}/cm^3$, or about $5\times10^{20}/cm^3$ to about $1\times10^{21}/cm^3$, although other concentrations are contemplated.

Figure 4:
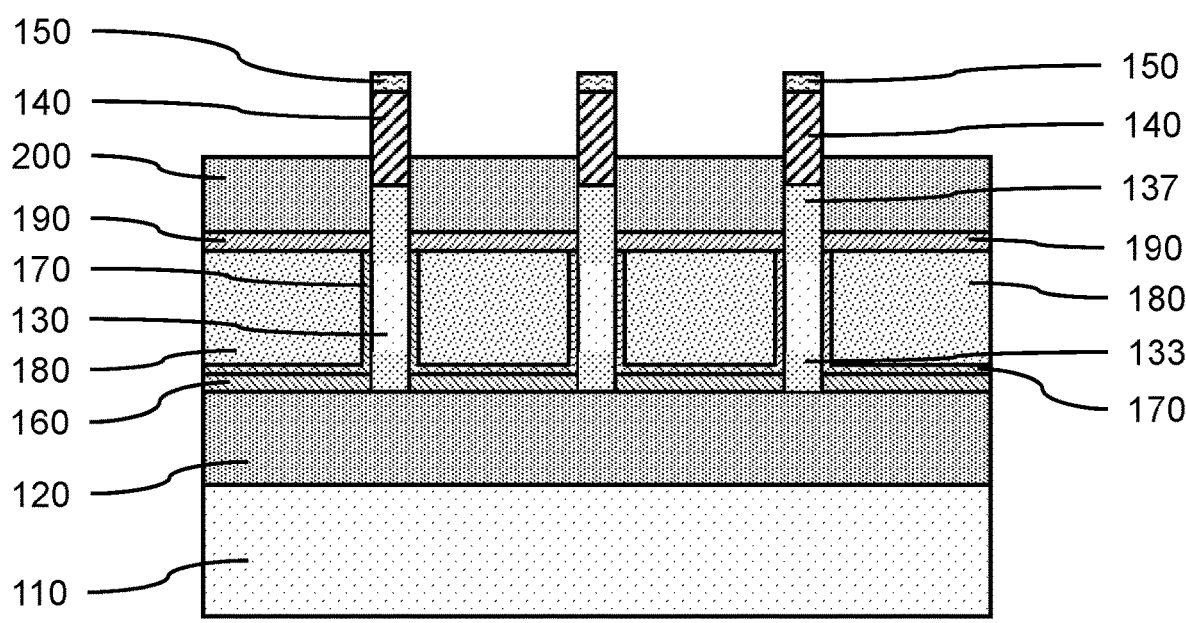
FIG. 4 is a cross-sectional side view showing top and bottom extension regions formed in each of the plurality of vertical fins from the top and bottom source/drain layers, in accordance with an embodiment of the present invention.

FIG. 4 is a cross-sectional side view showing top and bottom extension regions formed in each of the plurality of vertical fins from the top and bottom source/drain layers, in accordance with an embodiment of the present invention.

In one or more embodiments, the top source/drain layer 200, bottom source/drain layer 120, and vertical fin(s) 130 can be heat treated to diffuse dopants from the top source/drain layer 200 and bottom source/drain layer 120 into the adjacent regions of the vertical fin(s) to form a top extension region 137 and a bottom extension region 133. In various embodiments, the top extension region 137 and a bottom extension region 133 can have a dopant concentration in a range of about $1\times10^{19}/cm^3$ to about $3\times10^{21}/cm^3$, or about $5\times10^{20}/cm^3$ to about $3\times10^{21}/cm^3$, where the extension regions can be about $1\times10^{19}/cm^3$ at the device channel and about $5\times10^{20}/cm^3$ to about $3\times10^{21}/cm^3$ at the interface with the top source/drain layer 200 and bottom source/drain layer 120.

In various embodiments, the heat treatment can be conducted at a temperature in the range of about 800° C. to about 1300° C., or about 950° C. to about 1050° C. The heat treatment can be conducted for a duration in a range of about 30 milliseconds (msec) to about 30 seconds (sec). The heat treatment can be laser annealing, flash annealing, rapid thermal annealing (RTA), furnace annealing, or any suitable combination thereof. The thickness of the top spacer layer 190 and bottom spacer layer 160 can be the same, so dopants would diffuse the same distances to control the lengths of the top and bottom extension regions. The top extension region 137 can extend below the bottom surface of the top spacer layer 190 and the bottom extension region 133 can extend above the top surface of the bottom spacer layer 160, such that the top and bottom extension regions overlap with the gate structure.

Figure 5:
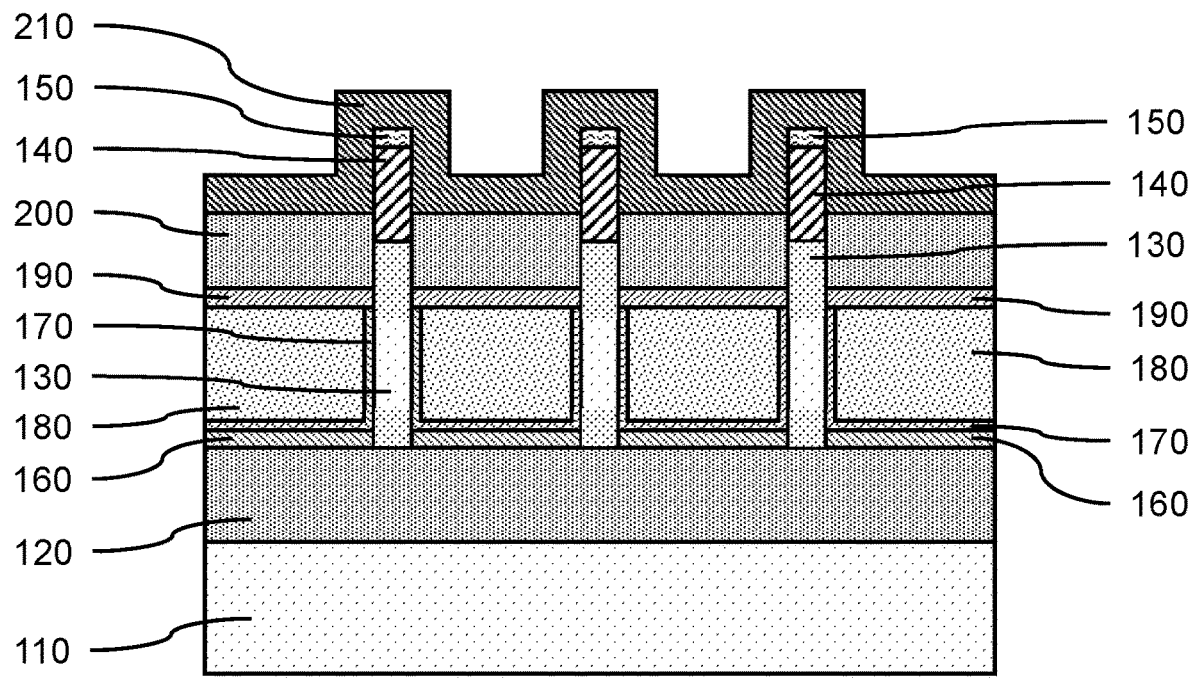
FIG. 5 is a cross-sectional side view showing a sacrificial layer formed on the top source/drain layer, fin templates, and fin caps, in accordance with an embodiment of the present invention.

FIG. 5 is a cross-sectional side view showing a sacrificial layer formed on the top source/drain layer, fin templates, and fin caps, in accordance with an embodiment of the present invention.

In one or more embodiments, a sacrificial layer 210 can be formed on exposed surfaces of the top source/drain layer 200, fin templates 140, and fin caps 150, where the sacrificial layer 210 can be formed by a conformal deposition (e.g., ALD, PEALD, low pressure chemical vapor deposition (LPCVD), or a combination thereof).

In one or more embodiments, the sacrificial layer 210 can have a thickness in a range of about 3 nm to about 12 nm, or about 5 nm to about 10 nm, although other thicknesses are also contemplated. The thickness of the sacrificial layer 210 on the sidewalls of the fin templates 140 can determine the width of sacrificial spacers subsequently formed on the top source/drain layer 200.

In one or more embodiments, the sacrificial layer 210 can be made of a dielectric material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof. In a non-limiting exemplary embodiment, the sacrificial layer 210 can be silicon boro carbonitride (SiBCN) or stoichiometric silicon nitride ($Si_3N_4$), where the sacrificial layer 210 can be the same material as the fin templates 140 to allow the fin templates 140 and subsequently formed sacrificial spacers to be removed at the same time.

Figure 6:
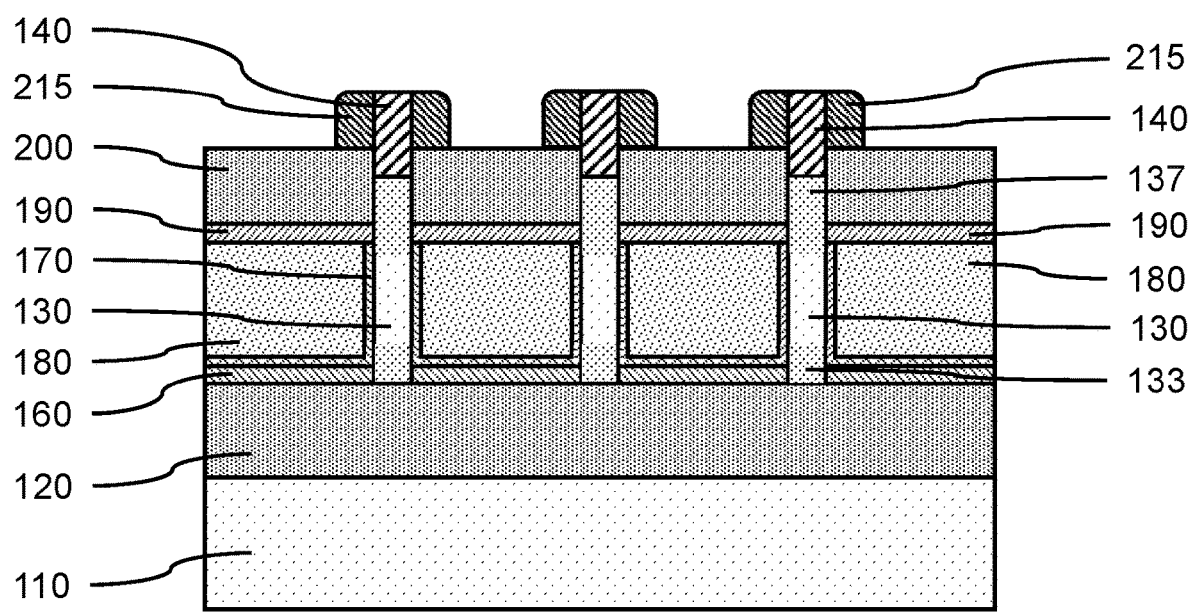
FIG. 6 is a cross-sectional side view showing a portion of the sacrificial layer removed from the top source/drain layer to form sacrificial spacers on the fin templates, and the fin caps removed from the fin templates, in accordance with an embodiment of the present invention.

FIG. 6 is a cross-sectional side view showing a portion of the sacrificial layer removed from the top source/drain layer to form sacrificial spacers on the fin templates, and the fin caps removed from the fin templates, in accordance with an embodiment of the present invention.

In one or more embodiments, a portion of the sacrificial layer 210 can be removed to form sacrificial spacers 215 on the top source/drain layer 200, where the portion of the sacrificial layer 210 can be removed using a directional etch, for example, a reactive ion etch (RIE). The portion of the sacrificial layer 210 on the top source/drain layer 200 can be etched back to leave sacrificial spacers 215 on the sidewalls of the fin templates 140. The fin caps 150 can also be removed as part of the etch-back process to expose the top surface of the fin templates 140. In various embodiments, the sacrificial spacers 215 can have the same width as the thickness of the sacrificial layer 210. The width of the sacrificial spacers 215 can be about the same as the width of the vertical fins and fin templates 140.

Figure 7:
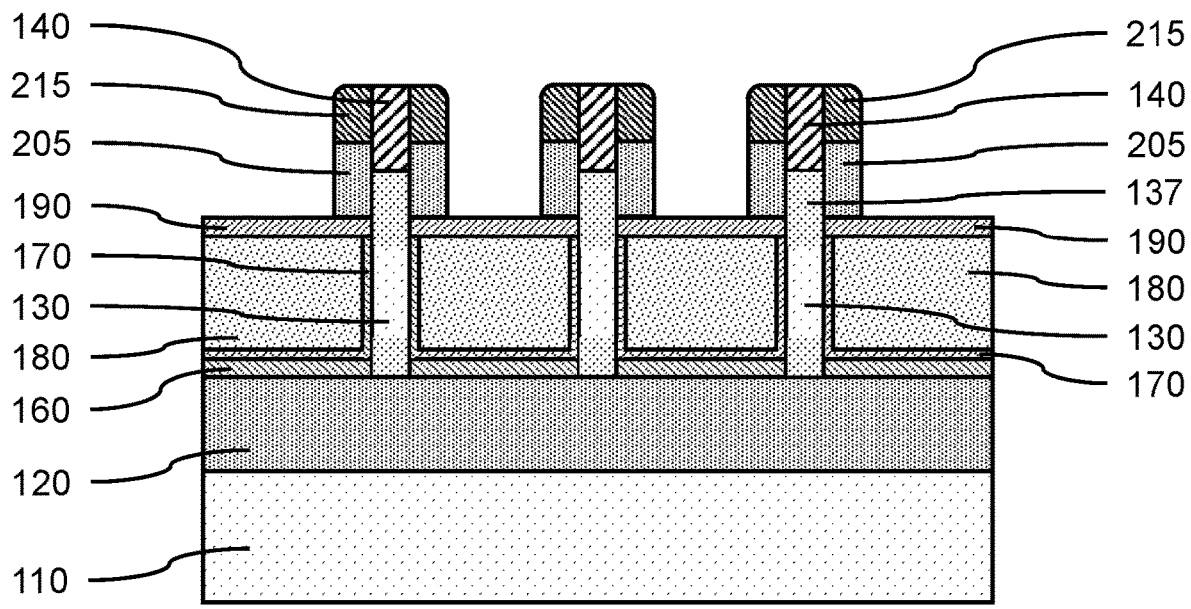
FIG. 7 is a cross-sectional side view showing a portion of the top source/drain layer removed to form top source/drains on an upper portion of the vertical fins, in accordance with an embodiment of the present invention.

FIG. 7 is a cross-sectional side view showing a portion of the top source/drain layer removed to form top source/drains on an upper portion of the vertical fins, in accordance with an embodiment of the present invention.

In one or more embodiments, a portion of the top source/drain layer 200 exposed by forming the sacrificial spacers 215 can be removed to expose the underlying top spacer layer 190. The portion of the top source/drain layer 200 can be removed using a directional etch (e.g., RIE), where the sacrificial spacers 215 can mask the underlying portion of the top source/drain layer 200. Removal of the exposed portion of the top source/drain layer 200 can form top source/drains 205 on upper portions of the vertical fin(s) 130 and lower portions of the fin templates 140. The top source/drains 205 can be adjoining and in electrical contact with the top extension region 137 of the vertical fin, where the top source/drains 205 can be a doped, crystalline semiconductor.

In various embodiments, removal of portions of the top source/drain layer 200 forms gaps between the top source/drains 205 that can physically and electrically separate the top source/drains 205 and vertical fins 130, for example, to form separate FinFET devices. In various embodiments, top source/drains 205 can be electrically connected together with a conductive material to create merged top source/drains 205 that electrically connect two or more vertical fins to form merged devices. The resulting top source/drains 205 can have consistent sizes and crystal alignment.

Figure 8:
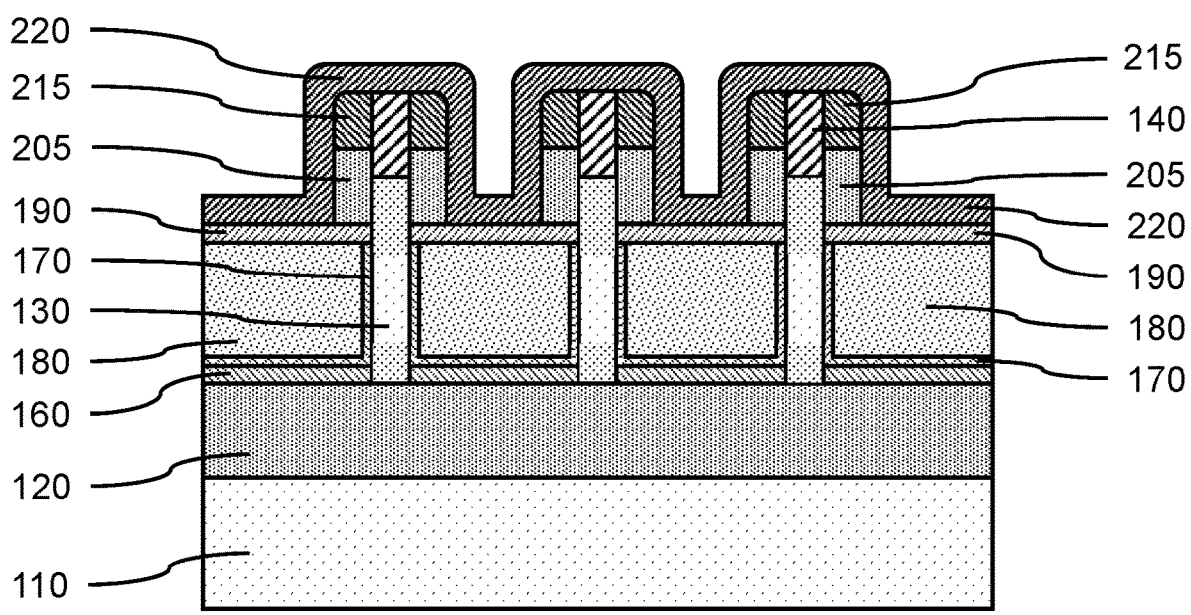
FIG. 8 is a cross-sectional side view showing an insertion layer formed on the top source/drains and sacrificial spacers, in accordance with an embodiment of the present invention.

FIG. 8 is a cross-sectional side view showing an insertion layer formed on the top source/drains and sacrificial spacers, in accordance with an embodiment of the present invention.

In one or more embodiment, an insertion layer 220 can be formed on the top spacer layer 190, top source/drains 205, sacrificial spacers 215, and fin templates 140, where the insertion layer 220 can be formed by a conformal deposition (e.g., ALD, PEALD, LPCVD). The insertion layer 220 can be formed to a predetermined thickness, where the thickness can determine the size of a hollow space adjacent to the top source/drains 205.

In one or more embodiments, the insertion layer 220 can have a thickness in a range of about 5 nm to about 15 nm, or about 5 nm to about 10 nm, although other thicknesses are also contemplated. The thickness of the insertion layer 220 on the sidewalls of the top source/drains 205 can determine the width of sidewall spacers subsequently formed on the top spacer layer 190.

In various embodiments, the insertion layer 220 can be a dielectric material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof. In a non-limiting exemplary embodiment, the insertion layer 220 can be the same material as sacrificial spacers 215.

Figure 9:
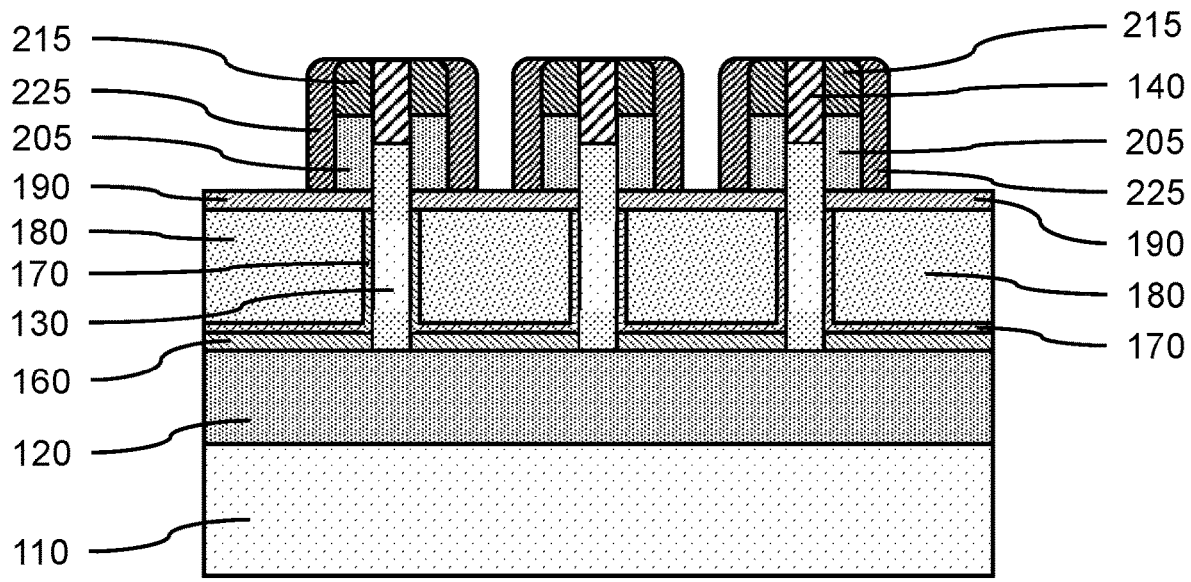
FIG. 9 is a cross-sectional side view showing a portion of the insertion layer removed to form sidewall spacers on the top source/drains and sacrificial spacers, in accordance with an embodiment of the present invention.

FIG. 9 is a cross-sectional side view showing a portion of the insertion layer removed to form sidewall spacers on the top source/drains and sacrificial spacers, in accordance with an embodiment of the present invention.

In one or more embodiments, a portion of the insertion layer 220 can be removed to form sidewall spacers 225 on the top spacer layer 190, and on the sidewalls of the top source/drains 205 and sacrificial spacers 215. The portion of the insertion layer 220 can be removed using a directional etch (e.g., RIE) to expose portions of the underlying top spacer layer 190 and the tops surfaces of the sacrificial spacers 215 and fin templates 140.

Figure 10:
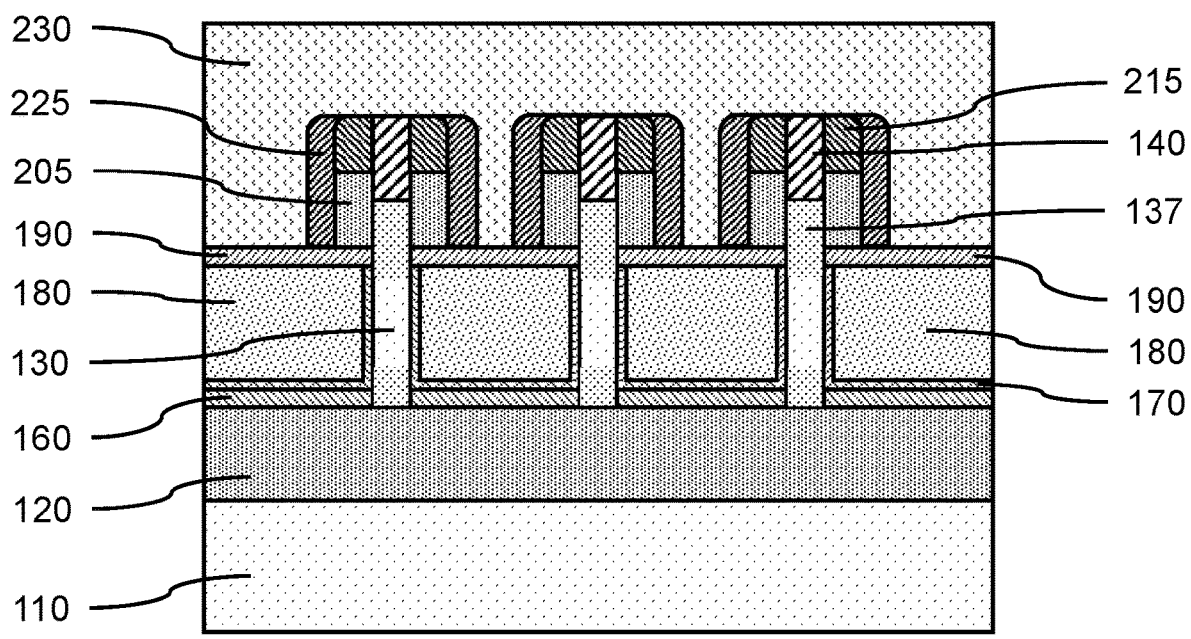
FIG. 10 is a cross-sectional side view showing an interlayer dielectric (ILD) layer formed on the sidewall spacers, sacrificial spacers, and fin templates, in accordance with an embodiment of the present invention.

FIG. 10 is a cross-sectional side view showing an interlayer dielectric (ILD) layer formed on the sidewall spacers, sacrificial spacers, and fin templates, in accordance with an embodiment of the present invention.

In one or more embodiments, an interlayer dielectric (ILD) layer 230 can be formed on the sidewall spacers 225, sacrificial spacers 215, and fin templates 140, where the interlayer dielectric (ILD) layer 230 can be formed by a blanket deposition (e.g., CVD, PECVD). The ILD layer can cover and extend above the top spacer layer 230, sidewall spacers 225, sacrificial spacers 215, and fin templates 140.

In various embodiments the ILD layer 230 can be a dielectric material, including, but not limited to, silicon oxide (SiO) or a low-k material. A low-k dielectric can include, but not be limited to, carbon doped silicon oxide (SiO:C), fluorine doped silicon oxide (SiO:F), polymeric material, for example, tetraethyl orthosilicate (TEOS), hydrogen silsesquioxane (HSQ) and methylsilsesquioxane (MSQ), and combinations thereof.

Figure 11:
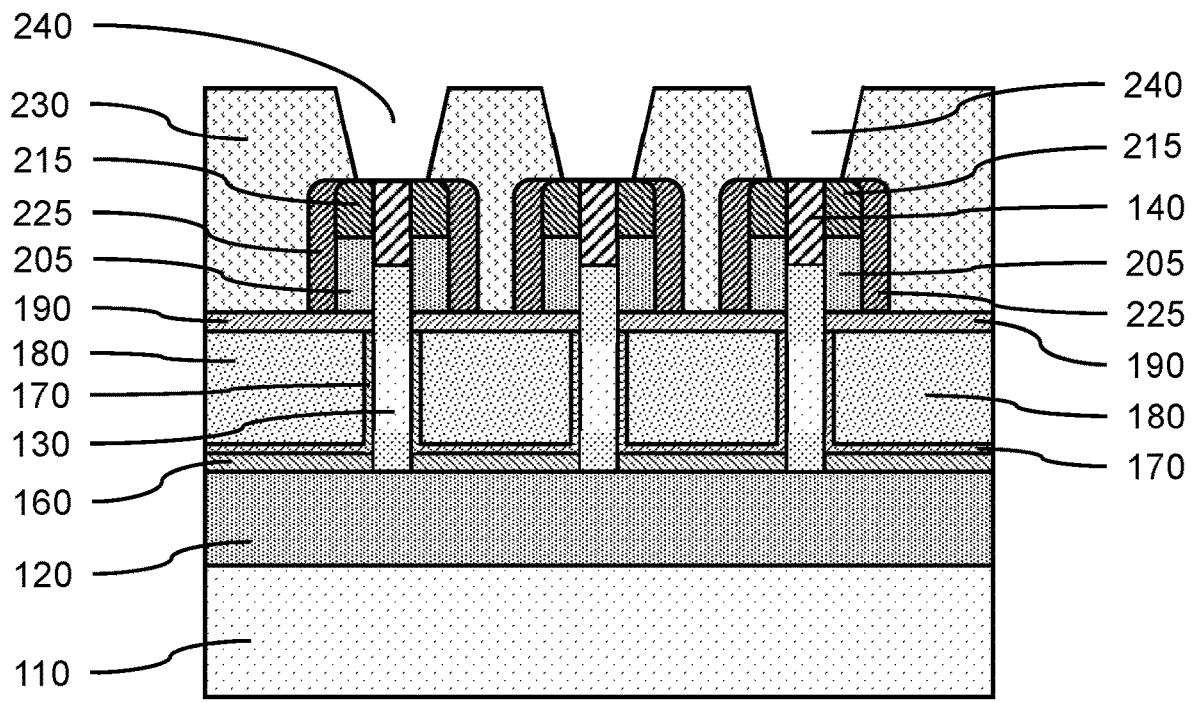
FIG. 11 is a cross-sectional side view showing openings formed in the ILD layer that expose the sacrificial spacers and fin templates, in accordance with an embodiment of the present invention.

FIG. 11 is a cross-sectional side view showing openings formed in the ILD layer that expose the sacrificial spacers and fin templates, in accordance with an embodiment of the present invention.

In one or more embodiments, one or more openings 240 can be formed in the ILD layer 230, where a separate opening 240 can be formed above each of one or more of the vertical fins 130, fin templates 140, and sacrificial spacers 215. The openings 240 can expose the top surfaces of the fin templates 140 and sacrificial spacers 215. The openings 240 can be formed in the ILD layer 230 by lithographic masking and etching processes, where a mask layer can be formed on the ILD layer.

Figure 12:
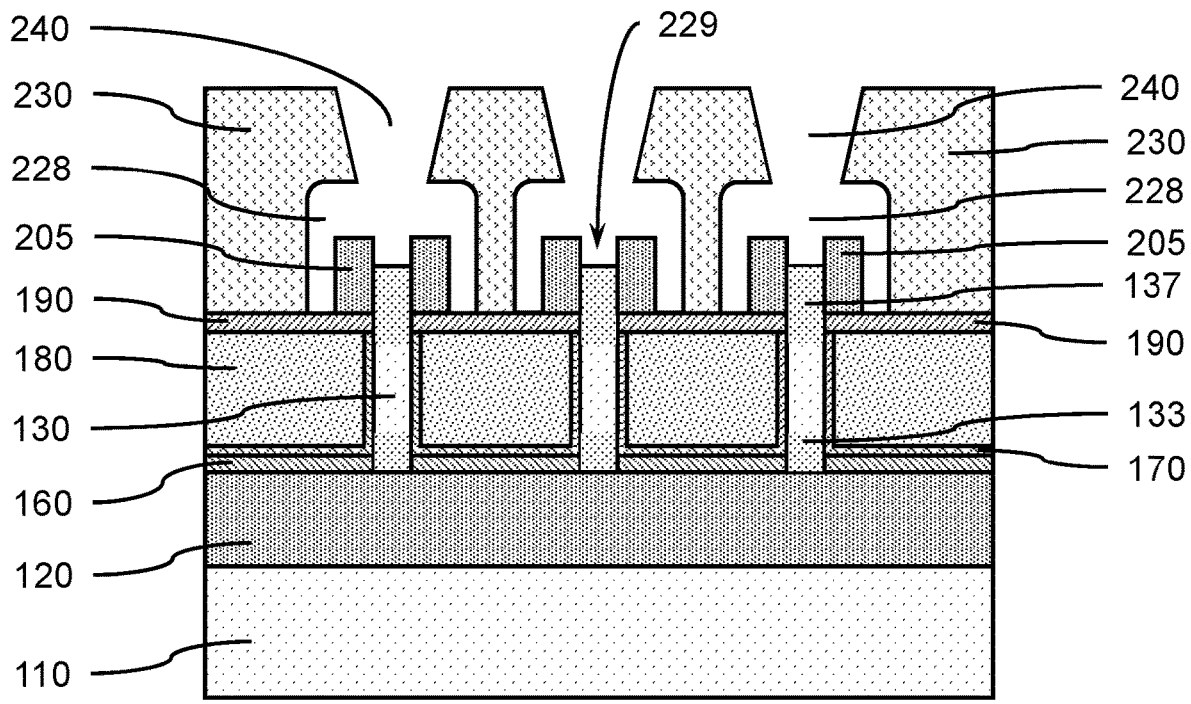
FIG. 12 is a cross-sectional side view showing the exposed sacrificial spacers and fin templates removed to form a hollow space around the top source/drains, in accordance with an embodiment of the present invention.

FIG. 12 is a cross-sectional side view showing the exposed sacrificial spacers and fin templates removed to form a hollow space around the top source/drains, in accordance with an embodiment of the present invention.

In one or more embodiments, the exposed fin templates 140 and sacrificial spacers 215 can be removed by a selective isotropic etch, for example, a wet chemical etch or dry plasma etch, where removal of the sacrificial spacers 215 can expose an upper portion of the sidewall spacers 225. The sidewall spacers 225 can be removed using a selective etch, where removal of the fin template 140, sacrificial spacers 215, and sidewall spacers 225 above a vertical fin 130 and top source/drains 205 can form a hollow space 228 around the top source/drains 205 and a trough 229 over the vertical fin and between the inner sidewalls of the top source/drain. The hollow space 228 can expose the sidewalls of the top source/drains 205 and a portion of the top spacer layer 190.

Figure 13:
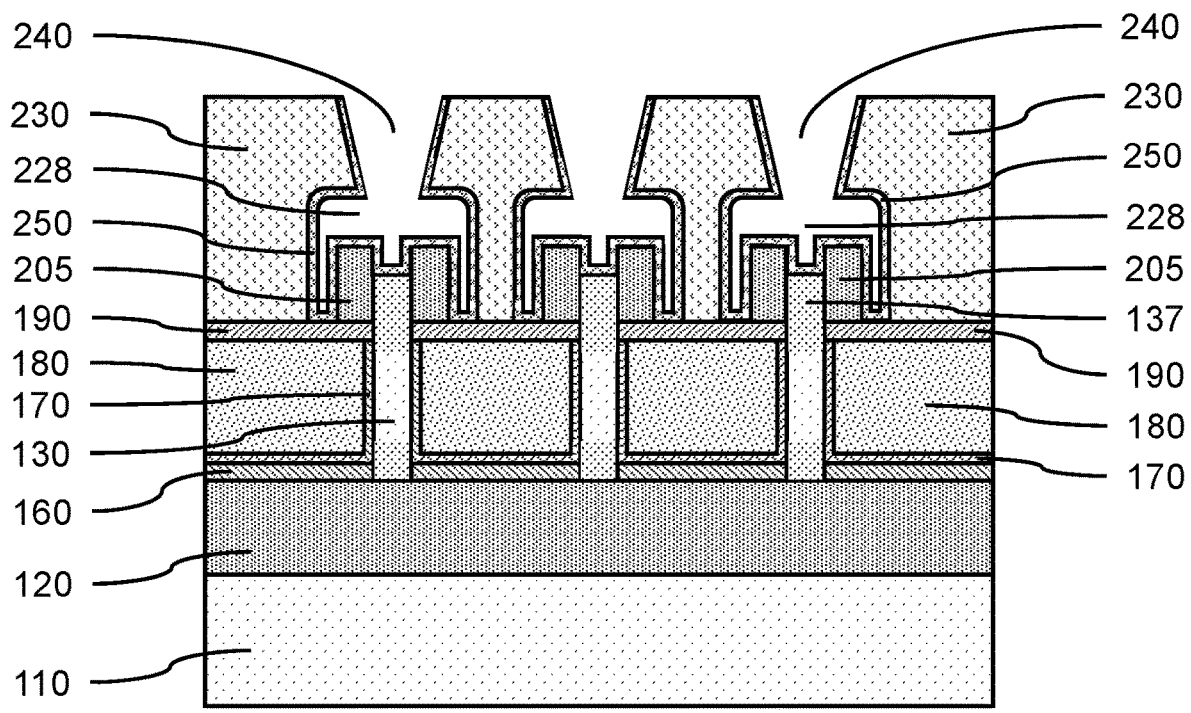
FIG. 13 is a cross-sectional side view showing a barrier layer formed on the sidewalls of the openings and hollow spaces formed in the ILD layer, and on the exposed surfaces of the top source/drains and top extension region, in accordance with an embodiment of the present invention.

FIG. 13 is a cross-sectional side view showing a barrier layer formed on the sidewalls of the openings and hollow spaces formed in the ILD layer, and on the exposed surfaces of the top source/drains and top extension region, in accordance with an embodiment of the present invention.

In one or more embodiments, a barrier layer 250 can be formed on the sidewalls of the openings 240 and hollow spaces 228 formed in the ILD layer 230, where the barrier layer 250 can be formed by a conformal deposition (e.g., ALD, PEALD). The barrier layer 250 can also form on the exposed surfaces of the top source/drains 205 and the top extension region 137 of the vertical fins 130, where the barrier layer 250 can cover the surfaces of the trough 229. The barrier layer 250 can act as a seed layer for depositing a conductive material in the openings 240 and hollow spaces 228, and to prevent diffusion of the conductive material into the ILD layer 230 and top source/drains 205. The barrier layer 250 can be a conductive material. In various embodiments, the barrier layer 250 can be titanium nitride (TiN), tantalum nitride (TaN), hafnium nitride (HfN), niobium nitride (NbN), tungsten nitride (WN), tungsten carbon nitride (WCN), or combinations thereof, where the barrier layer can prevent diffusion and/or alloying of the metal contact fill material with the top source drain material, and/or anode/cathode material. In various embodiments, the barrier layer can be deposited in the trench(es) by ALD, CVD, MOCVD, PECVD, or any suitable combination thereof.

In various embodiment, the barrier layer 250 can have a thickness in a range of about 0.5 nm to about 3 nm, or about 1 nm to about 2 nm, although other thicknesses are also contemplated.

Figure 14:
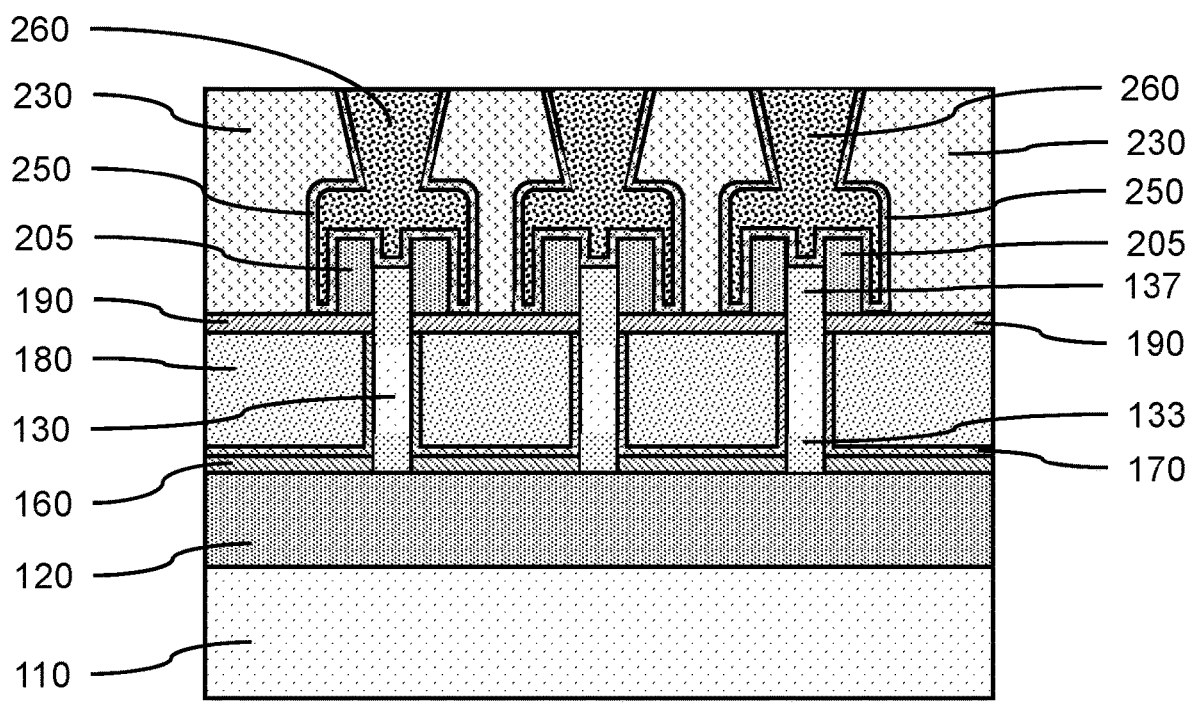
FIG. 14 is a cross-sectional side view showing a contact fill formed on the barrier layer in the openings and hollow spaces, in accordance with an embodiment of the present invention.

FIG. 14 is a cross-sectional side view showing a contact fill formed on the barrier layer in the openings and hollow spaces, in accordance with an embodiment of the present invention.

In one or more embodiments, a contact fill 260 can be formed on the barrier layer 250 in the openings 240, hollow spaces 228, and troughs 229, where the contact fill 260 can be formed by, for example, metal-organic chemical vapor deposition (MOCVD), ALD, CVD, PVD, plating, electroplating, or any suitable combination thereof, onto the barrier layer 250.

In various embodiment, the contact fill 260 can be a conductive material, for example, a metal including, but not limited to, tungsten (W), aluminum (Al), or copper (Cu), cobalt (Co), nickel (Ni), titanium (Ti), ruthenium (Ru).

In various embodiments, the contact fill 260 can fill in the hollow spaces 228 and wrap around the top source/drains 205 and top extension regions 137, where the contact fill 260 can be on portions of the sidewalls and top surfaces of the top source/drains 205.

In various embodiments, the formation of the contact fill 260 around the top source/drains 205 can increase the contact area of the contact fill 260 to the top source/drains 205 by at least two times (2×) or at least three time (3×), or at least four times (4×), where the increased electrical contact area can reduce the electrical resistance experienced by charge flowing through the vertical FinFET device. In a non-limiting exemplary embodiment, the interfacial surface area between a top source/drain 205 and a surrounding contact fill 260 can increase from about 20 nm$^2$ to about 65 nm$^2$, where the increase can depend on the height of the sidewalls of the top source/drains 205.

Figure 15:
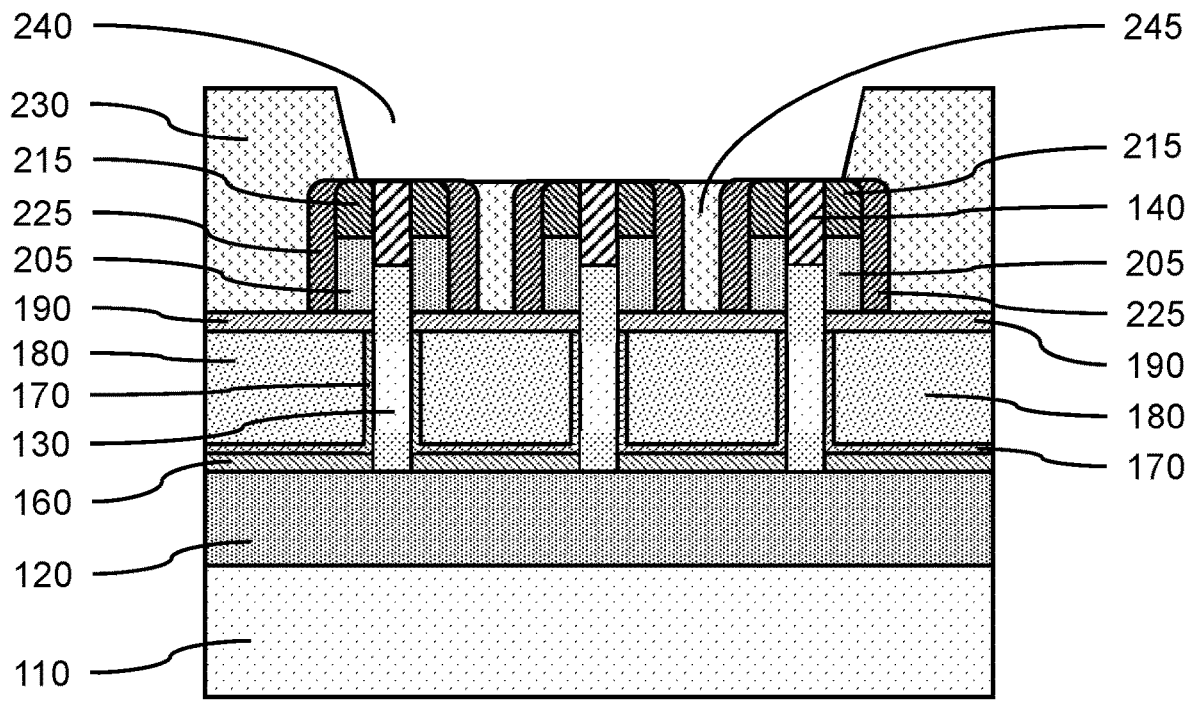
FIG. 15 is a cross-sectional side view showing an opening formed in the ILD layer that expose multiple sacrificial spacers, sidewall spacers, and fin templates, in accordance with another embodiment of the present invention.

FIG. 15 is a cross-sectional side view showing an opening formed in the ILD layer that expose multiple sacrificial spacers, sidewall spacers, and fin templates, in accordance with another embodiment of the present invention.

In one or more embodiments, a single opening 240 that exposes multiple fin templates 140, sidewall spacers 225, and sacrificial spacers 215 can be formed in the ILD layer 230. Segments of the ILD layer can remain between the sidewall spacers 225 on adjacent top source/drains forming intervening ILD blocks 245.

Figure 16:
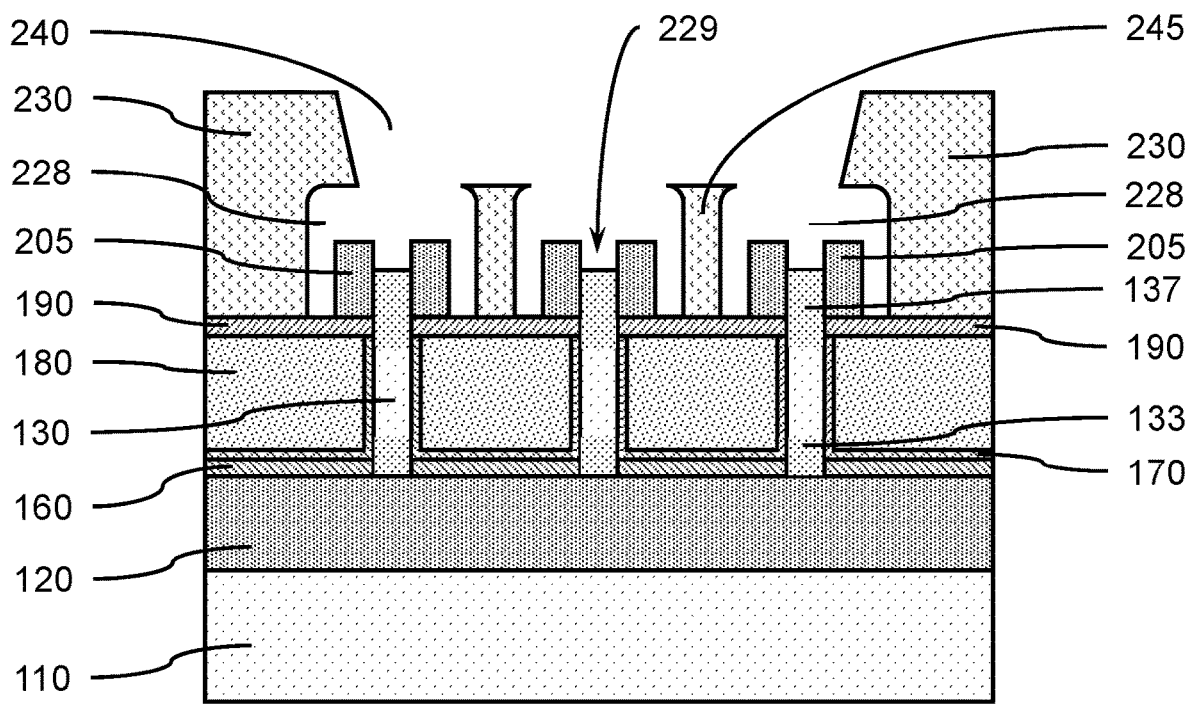
FIG. 16 is a cross-sectional side view showing the exposed sacrificial spacers, sidewall spacers, and fin templates removed to form a hollow space around multiple top source/drains, in accordance with another embodiment of the present invention.

FIG. 16 is a cross-sectional side view showing the exposed sacrificial spacers, sidewall spacers, and fin templates removed to form a hollow space around multiple top source/drains, in accordance with another embodiment of the present invention.

In one or more embodiments, the exposed fin templates 140, sacrificial spacers 215, and sidewall spacers 225 can be removed by a selective isotropic etch, for example, a wet chemical etch or dry plasma etch. The removal of the fin template 140, sacrificial spacers 215, and sidewall spacers 225 above a plurality of vertical fins 130 and top source/drains 205 can form an extended hollow space 228 around each of the top source/drains 205 and a trough 229 over each of the vertical fins and between the inner sidewalls of the top source/drains. Outer sidewalls of the top source/drains 205 can be facing an intervening ILD block 245.

Figure 17:
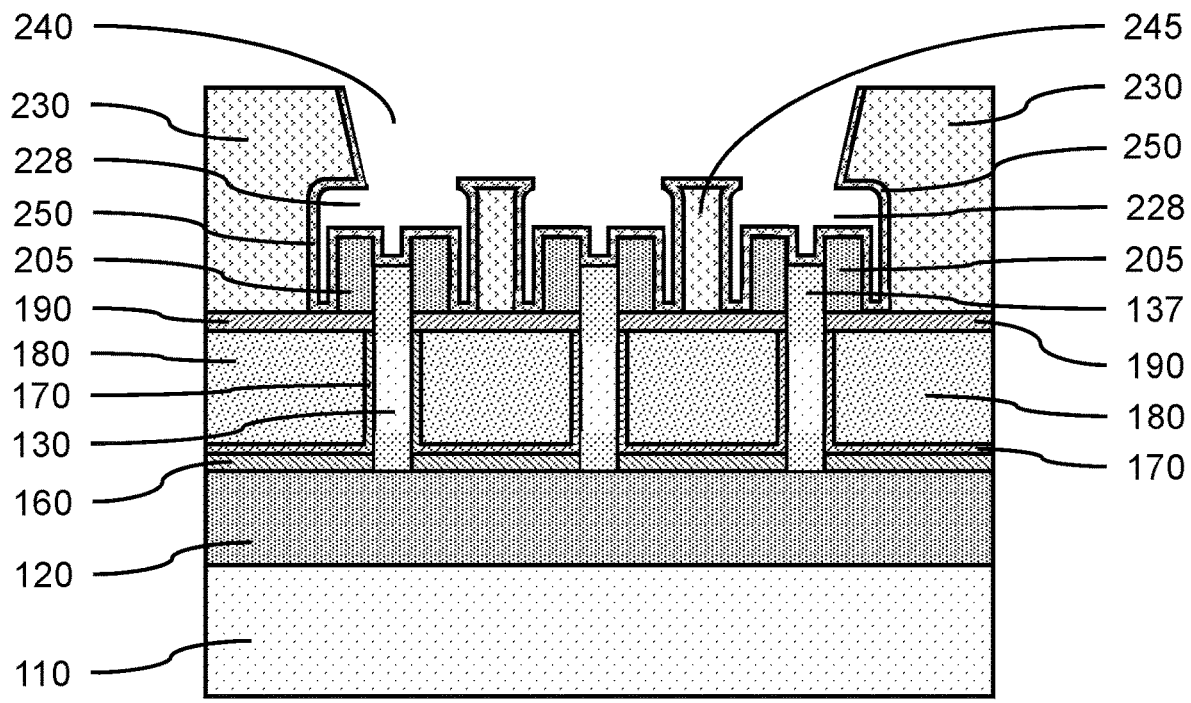
FIG. 17 is a cross-sectional side view showing a barrier layer formed on the sidewalls of the opening and hollow spaces formed in the ILD layer, and on the exposed surfaces of the top source/drains and top extension region, in accordance with another embodiment of the present invention.

FIG. 17 is a cross-sectional side view showing a barrier layer formed on the sidewalls of the opening and hollow spaces formed in the ILD layer, and on the exposed surfaces of the top source/drains and top extension region, in accordance with another embodiment of the present invention.

In one or more embodiments, a barrier layer 250 can be formed on the sidewalls of the opening 240 and hollow spaces 228 formed in the ILD layer 230, and on the exposed surfaces of the top source/drains 205, top extension regions 137, and ILD blocks 245. A continuous barrier layer 250 can span multiple top source/drains 205 and vertical fins 130, where the continuous barrier layer 250 can form an electrical connection between each of the multiple top source/drains 205.

Figure 18:
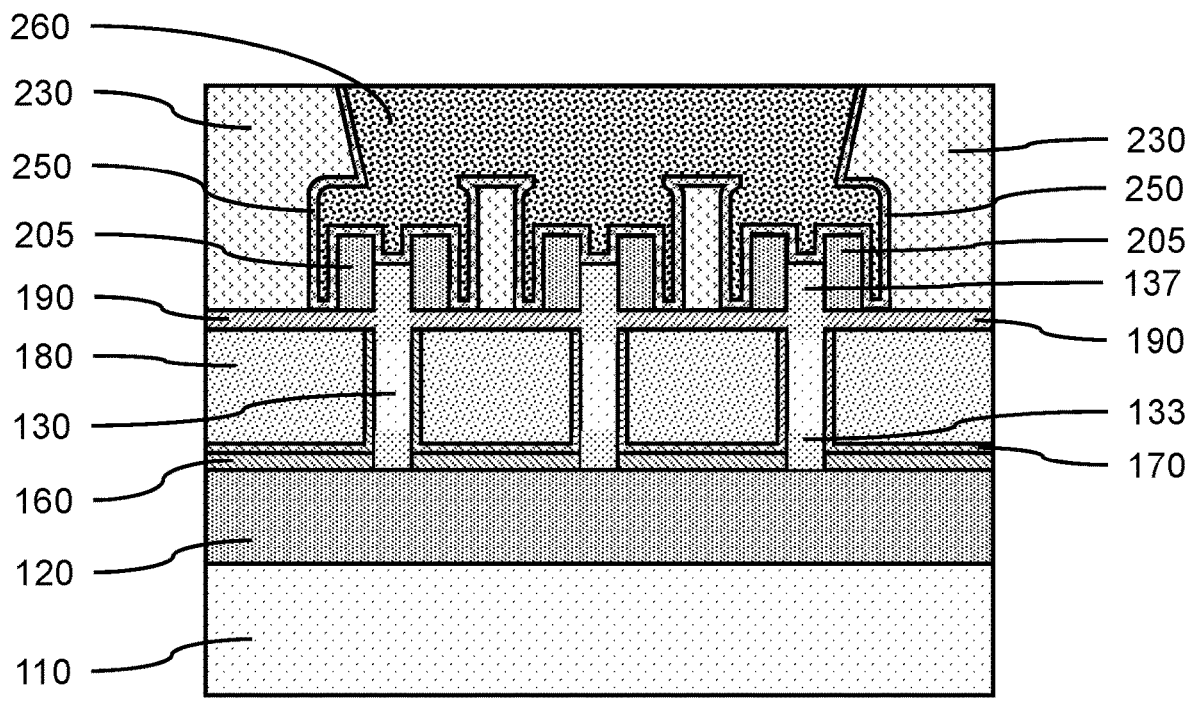
FIG. 18 is a cross-sectional side view showing a contact fill formed on the barrier layer in the opening and hollow spaces, in accordance with another embodiment of the present invention.

FIG. 18 is a cross-sectional side view showing a contact fill formed on the barrier layer in the opening and hollow spaces, in accordance with another embodiment of the present invention.

In one or more embodiments, a contact fill 260 can be formed on the barrier layer 250 in the opening 240, hollow spaces 228, and troughs 229, where the contact fill 260 can be a conductive metal. The contact fill 260 can form merged top source/drains 205 that electrically connect two or more vertical fins to form merged devices. The top source/drains 205 can be electrically connected together by the electrically conductive contact fill 260 and electrically conductive barrier layer 250.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is tinned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A fin field effect device, comprising:
one or more vertical fins on a substrate, the one or more vertical fins have a planar upper surface;
a gate structure on at least one of the one or more vertical fins;
a top spacer layer on the at least one gate structure, wherein at least an upper portion of the at least one of the one or more vertical fins extends above the top spacer layer;
a top source/drain on the top spacer layer and the upper portion of the at least one of the one or more vertical fins, wherein the top source/drain is on opposites sides of the upper portion of the at least one of the one or more vertical fins; and
a conductive contact fill that wraps around the sidewalls of the top source/drain and directly contacts the planar upper surface of the one or more vertical fins.

2. The fin field effect device of claim 1, further comprising a barrier layer on the top source/drain and a top surface of the at least one of the one or more vertical fins.

3. The fin field effect device of claim 2, further comprising an interlayer dielectric (ILD) layer on the top spacer layer and conductive fill, wherein the barrier layer separates the conductive fill from the interlayer dielectric (ILD) layer.

4. The fin field effect device of claim 3, further comprising a top extension region in the upper portion of the at least one of the one or more vertical fins.

5. The fin field effect device of claim 4, wherein the top extension region extends below a lower surface of the top spacer layer.

6. The fin field effect device of claim 5, wherein the top source/drain and top surface of the at least one of the one or more vertical fins forms a trough, and the conductive contact fill fills in the trough.

7. The fin field effect device of claim 6, further comprising a bottom extension region in a lower portion of the at least one of the one or more vertical fins.

8. The fin field effect device of claim 7, further comprising a bottom source/drain layer between the substrate and the one or more vertical fins on the substrate.

9. The fin field effect device of claim 8, further comprising a bottom spacer layer between the bottom source/drain layer and the gate structure.

10. The fin field effect device of claim 9, further comprising another gate structure on at least another one of the one or more vertical fins, wherein the top spacer layer is also on the another gate structure, and wherein at least an upper portion of the another one of the one or more vertical fins extends above the top spacer layer;
a second top source/drain on the top spacer layer and the upper portion of the another one of the one or more vertical fins, wherein the top source/drain is on opposites sides of the upper portion of the another one of the one or more vertical fins; and
a second conductive contact fill that wraps around the sidewalls of the second top source/drain.

11. A fin field effect device, comprising:
a plurality of vertical fins on a substrate, the plurality of vertical fins having a planar upper surface;
a gate structure on each of the plurality of vertical fins;
a top spacer layer on the gate structure, wherein at least an upper portion of each of the plurality of vertical fins extends above the top spacer layer;
a separate top source/drain on the top spacer layer and the upper portion of each of the plurality of vertical fins, wherein each of the separate top source/drains is on opposites sides of the upper portion of each of the plurality of vertical fins; and a conductive contact fill that wraps around sidewalls of each of the top source/drains and directly contacts the planar upper surface of one or more of the plurality of the vertical fins.

12. The fin field effect device of claim 11, further comprising a barrier layer on the top spacer layer, top source/drains, and a top surface of each of the plurality of vertical fins.

13. The fin field effect device of claim 12, wherein the barrier layer and conductive contact fill is within a trough between the sidewalls of the top source/drains on each vertical fin and the surface of each vertical fin.

14. The fin field effect device of claim 13, further comprising an intervening ILD block between each adjacent pair of top source/drains, wherein the barrier layer is on the intervening ILD block(s).

15. A vertical fin field effect transistor device, comprising:
one or more vertical fins on a substrate, the one or more vertical fins having a planar upper surface;
a top source/drain electrically connected to sidewall surfaces of at least one of the one or more vertical fins, wherein the top source/drain and top surface of the at least one of the one or more vertical fins forms a trough;
a barrier layer that is present on the one or more vertical fins and the top source/drain; and
a conductive contact fill contacting the barrier layer, the conductive contact fill wraps around the sidewalls of the top source/drain and is on a top surface of the at least one of the one or more vertical fins, wherein the trough is filled with the conductive contact fill.

16. The vertical fin field effect transistor device of claim 15, further comprising a top extension region in an upper portion of the at least one of the one or more vertical fins, and a bottom extension region in a lower portion of the at least one of the one or more vertical fins.

17. The vertical fin field effect transistor device of claim 16, further comprising a bottom source/drain layer between the substrate and the one or more vertical fins, and a gate structure on the bottom source/drain layer and at least one of the one or more vertical fins.

18. The vertical fin field effect transistor device of claim 17, further comprising a top spacer layer on the at least one gate structure, and a bottom spacer layer between the bottom source/drain layer and the at least one gate structure, wherein the top extension region extends below the top spacer layer.

* * * * *